United States Patent [19]

Miyazaki et al.

[11] 4,449,579
[45] May 22, 1984

[54] COOLING APPARATUS FOR A CLOSED HOUSING

[75] Inventors: Yoshiro Miyazaki, Tokyo; Toshio Yasunaga; Tomiya Sasaki, both of Yokohama, all of Japan

[73] Assignee: Tokyo Shibaura Denki Kabushiki Kaisha, Kawasaki, Japan

[21] Appl. No.: 341,055

[22] Filed: Jan. 20, 1982

[30] Foreign Application Priority Data

Jan. 30, 1981 [JP] Japan .................... 56-11509

[51] Int. Cl.³ .............................................. F28D 15/00
[52] U.S. Cl. ...................... 165/104.33; 165/104.34; 361/381; 361/385
[58] Field of Search ............... 165/104.33, 104.21, 165/104.34; 361/385, 381, 382; 357/82; 336/57

[56] References Cited

U.S. PATENT DOCUMENTS

| | | |
|---|---|---|
| 3,807,493 | 4/1974 | Stewart. |
| 3,421,338 | 1/1969 | Gidseg. |
| 3,888,304 | 6/1975 | Laing. |
| 2,499,736 | 3/1950 | Kleen. |
| 3,836,220 | 9/1974 | Ishammar. |
| 2,247,028 | 6/1941 | Kuntz. |
| 2,206,858 | 7/1940 | McKee. |
| 3,156,102 | 11/1964 | Costantini. |

FOREIGN PATENT DOCUMENTS

| | | | |
|---|---|---|---|
| 2743708 | 4/1979 | Fed. Rep. of Germany ...... 361/385 |
| 52-144767 | 12/1977 | Japan . | |
| 2330965 | 6/1977 | France | |
| 21441 | 2/1978 | Japan ............................. 165/104.33 |
| 116039 | 9/1980 | Japan .......................... 165/DIG. 12 |

*Primary Examiner*—Albert W. Davis, Jr.
*Attorney, Agent, or Firm*—Oblon, Fisher, Spivak, McClelland & Maier

[57] ABSTRACT

A cooling apparatus for a housing which is provided with an opening at the upper part thereof, comprises a casing located on the upper part of the housing and including a bottom plate to close the opening and a chamber, a partition wall provided in the casing to divide the chamber into a first chamber section and a second chamber section, heat exchanger including at least one heat pipe provided in the casing through the partition wall with coolant therein for exchanging heat in the first chamber section with heat in the second chamber section. The heat pipe has one end portion in the first chamber section and the other end portion in the second chamber section, and inclines with the one end portion located lower than the other end portion.

7 Claims, 3 Drawing Figures

COOLING APPARATUS FOR A CLOSED HOUSING

BACKGROUND OF THE INVENTION

This invention relates to a cooling apparatus for a closed housing cut off from the outside atmosphere, more specifically to a cooling apparatus provided with a heat-pipe-type heat exchanger and adapted to be mounted on a closed housing which contains therein electronic equipment to be protected from the outside atmosphere.

Recently, the application of electronic equipment, especially computers, have been remarkably extended, and process computers have come to enjoy use in even job sites in factories. Ambient air in a job site may contain dust or poisonous gas which has a bad influence upon the process computer and may cause malfunction thereof. In order to be protected from the outside environment, therefore, the process computer needs to be contained in a closed housing.

During operation, however, the process computer generates heat, whereas the closed housing cannot be ventilated without affecting the performance of the process computer. Unless the interior of the housing is cooled, therefore, the process computer cannot help being heated by heat which is internally generated from itself. If heated, the process computer is liable to malfunction. Accordingly, there is proposed a cooling apparatus for a closed housing provided with a heat-pipe-type heat exchanger.

FIG. 1 shows a cooling apparatus 12 for a closed housing 10. The cooling apparatus 12 is provided with a cooling chamber 14 which is attached to one side face of the closed housing 10 in which a process computer is provided. The cooling chamber 14 is divided into two isolated parts, upper and lower chambers 18 and 20, by a partition wall 16 extending horizontally. The upper chamber 18 communicates with the outside air by means of an outer inlet opening 22 and an outer outlet opening 24. The lower chamber 20 communicates with the interior of the closed housing 10 by means of an inner inlet opening 26 and an inner outlet opening 28. Exhaust fans 30 and 32 are disposed inside the outer outlet opening 24 of the upper chamber 18 and the inner outlet opening 28 of the lower chamber 20, respectively. The outside air flows through the upper chamber 18, and air in the housing 10 flows through the lower chamber 20 by means of their corresponding fans 30 and 32. A plurality of heat pipes 34 containing a refrigerant therein airtightly penetrate the partition wall 16 along the vertical direction each with both end portions located in the upper and lower chambers 18 and 20, respectively. Each heat pipe 34 is fitted with a multitude of fins 36 along the axial direction. The upper end portions of the heat pipes 34 are defined as a refrigerant condensing section, while the lower end portions are defined as a refrigerant evaporating section.

In the cooling apparatus thus constructed, the interior of the closed housing 10 is cooled in accordance with the following processes. Air in the closed housing 10 heated by heat generated from the process computer is introduced through the inner inlet opening 26 into the lower chamber 20 by the fan 32. The introduced air is caused to make heat exchange by means of the evaporating section of the heat pipes 32 and the fins 36. As a result, the heat of the air is absorbed by the heat pipes 34 to cool the air, and the refrigerant is evaporated at the evaporating section of the heat pipes 34 to which the heat is applied. The cooled air is returned through the inner outlet opening 28 to the interior of the housing 10 to cool the same.

Meanwhile, the heated and evaporated refrigerant rises up through the heat pipes 34 to reach the condensing section inside the upper chamber 18. The outside air is introduced through the outer inlet opening 22 into the upper chamber 18 by the fan 30, and is caused to make heat exchange by means of the condensing sections of the heat pipes 34 and the fins 36. Accordingly, the heat of the refrigerant is absorbed by the outside air. As a result, the outside air is heated, while the refrigerant is cooled and condensed. The condensed refrigerant falls down to the evaporating section by its own weight, and the heated outside air is discharged through the outer outlet opening 24 into the outside space.

Thus, the air inside the closed housing 10 is caused to exchange heat with the outside air and thence to be cooled by means of the heat pipes 34. Namely, the housing 10 is cooled inside as it is closed, so that the process computer contained in the housing 10 may be protected from dust and heat.

Mounted on one side face of the closed housing 10, however, the prior art cooling apparatus 12 has the following drawbacks. First, the side face of the housing 10 is subject to a restriction on size depending on the setting conditions of the housing 10, as well as to many other restrictions attributed to the attachment of a door, meter, harness, connector, etc., thereon, so that the cooling apparatus 12 need be designed according to the particulars of the individual housing 10. Accordingly, it is difficult to put the cooling apparatus 12 to general use, and the apparatus cannot enjoy any reduction in cost. Secondly, due to the setting location of the cooling apparatus 12 on the side wall of the housing 10, the housing 10 requires an increased setting space when it is arranged in line with another one or put by a wall. Thirdly, whereas the upper portion is at the highest temperature inside the housing 10, the cooling apparatus 12 is attached to one side face of the housing 10 with the evaporating section located in the lower position. Accordingly, the air inlet opening 26 in the housing 10 has to be located in a relatively low position, constituting a hindrance to the improvement of cooling efficiency.

SUMMARY OF THE INVENTION

This invention is contrived in consideration of these circumstances, and is intended to provide a cooling apparatus for a closed housing, capable of enjoying general use and improved in compactness and cooling efficiency.

According to an aspect of this invention, there is provided a cooling apparatus for a housing which is provided with an opening at the top thereof, comprising a casing located on the top of the housing and including a bottom plate to close the opening and a chamber, a partition wall provided in the casing to divide the chamber into a first chamber section and a second chamber section, the bottom plate having a first inlet opening and a first outlet opening, the first chamber section communicating with the interior of the housing by means of the first inlet opening and first outlet opening, and the casing having a second inlet opening and a second outlet opening, the second chamber section communicating with the exterior of the housing by means of the second inlet opening and second outlet opening, heat exchange means including at least one heat pipe provided in the casing through the partition wall with coolant therein for exchanging heat in the first chamber section with heat in the second chamber section, the heat pipe having one end portion in the first chamber section and the other end portion in the second chamber section, and inclining with the one end portion located lower than the other end portion, a first fan provided in the first chamber section to generate a first air stream passing through the first inlet opening and first outlet opening and passing by the one end portion of the heat pipe, a second fan provided in the second chamber section to generate a second air stream passing through the second inlet and second outlet openings and passing by the other end portion of the heat pipe, and driving means provided in the casing for driving the first and second fans.

DETAILED DESCRIPTION OF THE PREFERRED EMBODIMENT

Figure 1:
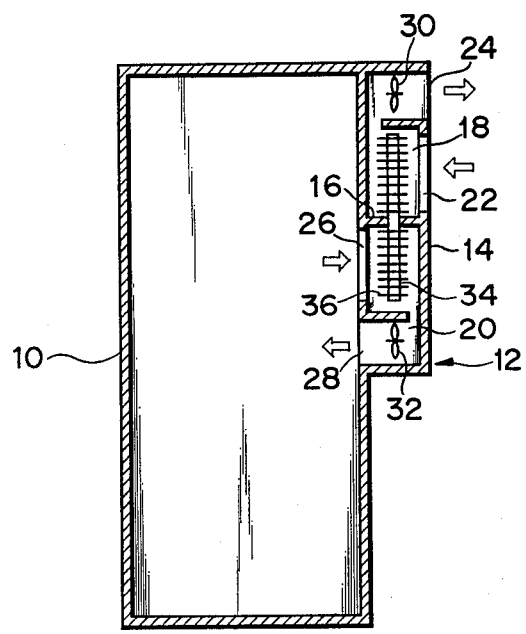
FIG. 1 is a side sectional view schematically showing a prior art cooling apparatus.
Figure 3:
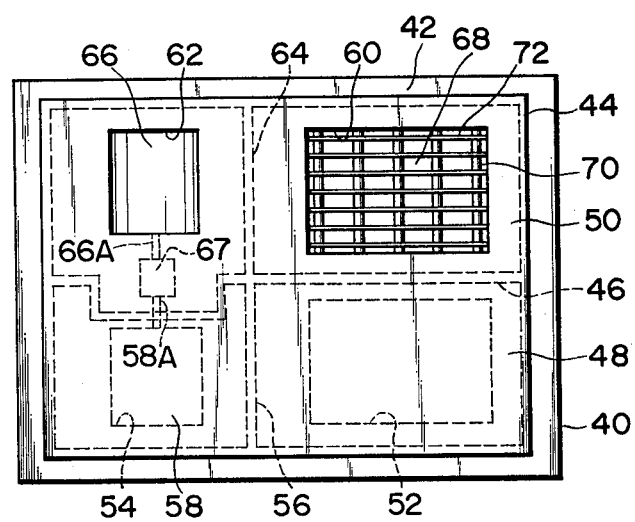
FIG. 3 is a top view of the apparatus shown in FIG. 2.
Figure 2:
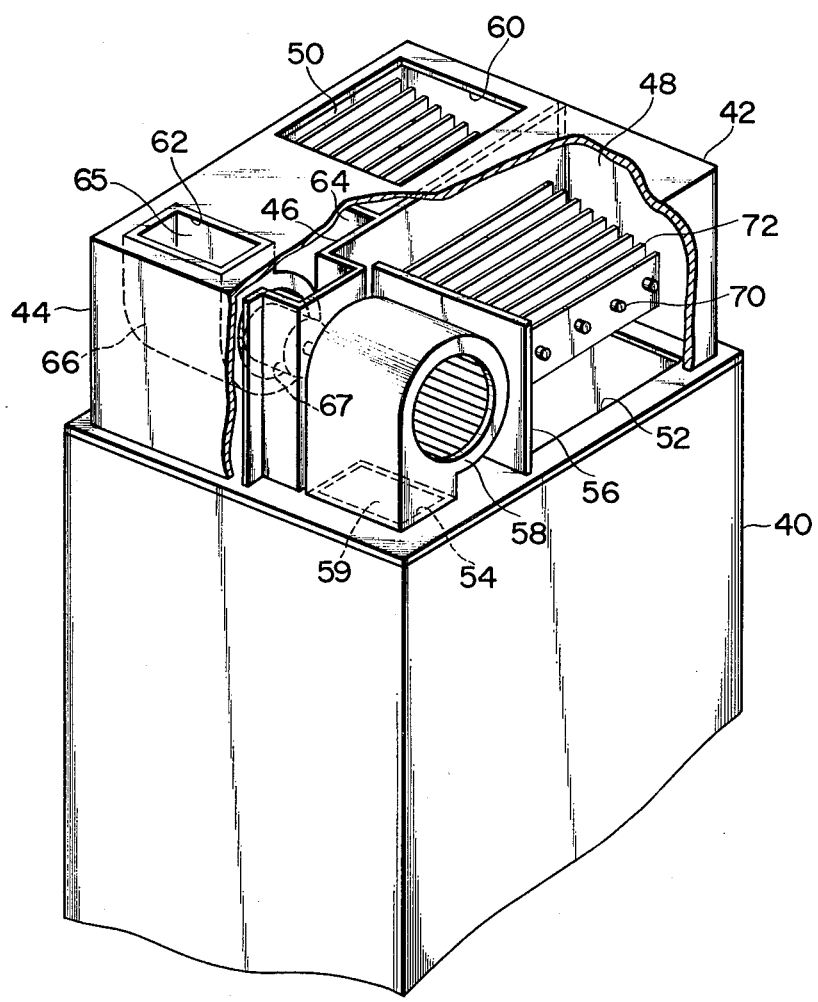
FIG. 2 is a partially broken perspective view of a cooling apparatus according to one embodiment of this invention.

Referring now to the accompanying drawings of FIGS. 2 and 3, there will be described in detail a cooling apparatus for a closed housing according to one embodiment of this invention.

In the drawings, reference numeral 40 designates a housing which contains therein electronic equipment (not shown) such as a process computer. The top of the housing 40 opens substantially over the length and breadth thereof, and a flange portion for mounting a cooling apparatus 42 as mentioned later is formed on the edge of the top of the housing 40 along the whole circumference thereof, inwardly projected a little.

The cooling apparatus 42 is mounted by means of the flange portion on the top of the housing 40 so as entirely to block up the opening portion of the housing 40. Thus, the housing 40 is closed up airtightly to protect the electronic equipment therein from dust or any poisonous gas.

The cooling apparatus 42 is provided with a casing 44 in the form of a rectangular prism. The interior of the casing 44 is defined as a heat exchange chamber. A partition wall 46 extends vertically inside the casing 44 to divide the heat exchange chamber into two parts, a cooling chamber 48 and a radiating chamber 50. The cooling chamber 48 and the radiating chamber 50 are isolated airtightly from each other.

Two openings 52 and 54 are formed in line in the bottom plate of the casing 44 on the cooling chamber side along the partition wall 46. The one opening 52 is defined as an inner inlet opening, while the other opening 54 is defined as an inner outlet opening. The interior of the housing 40 and the cooling chamber 48 communicate with each other by means of these openings 52 and 54. Disposed in the cooling chamber 48 is a baffle plate 56 which is located between the two openings 52 and 54 and vertically extends to intersect the partition wall 46 at right angles thereto. The baffle plate 56 divides the cooling chamber 48 into two parts, leaving a gap only between its upper edge and the top plate of the casing 44 whereby the two divided parts or spaces are allowed to communicate with each other. In that space which is on the side of the inner outlet opening 54 is provided a fan 58 for circulating air in such way that air first flows from the cooling chamber 48 into the housing 40 through the inner outlet opening 54 and then from the housing 40 into the chamber 48 through the inner inlet opening 52. In this embodiment, a fan is used for the fan 58. The sirocco fan 58 has its discharge port 59 opening into the inner outlet opening 54 and its driven shaft 58A (FIG. 3) intersecting the partition wall 46 at right angles thereto.

Two openings 60 and 62 are formed in line in the top plate of the casing 44 on the radiating chamber side along the partition wall 46. The one opening 60 is defined as an outer inlet opening, while the other opening 62 is defined as an outer outlet opening. As shown in FIG. 3, the outer inlet and outlet openings 60 and 62 are located on the same sides of the partition wall 46 with the inner inlet and outlet openings 52 and 54, respectively. The outer space of the casing 44 and the radiating chamber 50 communicate with each other by means of these openings 60 and 62. Disposed in the radiating chamber 50 is another baffle plate 64 which is located between the two openings 60 and 62 and vertically extends to intersect the partition wall 46 at right angles thereto. The baffle plate 64 divides the radiating chamber 50 into two parts, leaving a gap only between its lower edge and the bottom plate of the casing 44 whereby the two divided parts or spaces are allowed to communicate with each other. In that space which is on the side of the outer outlet opening 62 is provided another fan 66 for circulating air in such way that air first flows from the radiating chamber 50 into the outer space through the outer outlet opening 62 and then from the outer space into the radiating chamber 50 through the outer inlet opening 60. In this embodiment, a fan is used for the another fan 66. The fan 66 has its another discharge port 65 opening into the outer outlet opening 62 and its driven shaft 66A (FIG. 3) formed coaxially and integrally with the driven shaft 58A of the aforesaid fan 58.

A common motor 67 for driving the two fans 54 and 66 is disposed between these fans 54 and 66 and inside the radiating chamber 50. A driving shaft of the motor 67 is connected directly and coaxially with the driven shafts 58A and 66A of the fans 54 and 66. Accordingly, the driven shafts 58A and 66A of the fans 58 and 66 are rotated in accordance with the rotation of the driving shaft of the motor 67 to cause the fans 58 and 66 to blow.

The cooling apparatus 42 is provided with a heat exchanger 68 which extends from a space inside the cooling chamber 48 on the inner inlet opening side to a space inside the radiating chamber 50 on the outer inlet opening side. The heat exchanger 68 includes a plurality of heat pipes 70 in a single layer, airtightly penetrating the partition wall 46, each having one end located severally in the cooling chamber 48 and another end in the radiating chamber 50, and arranged at regular intervals. These heat pipes 70 are defined within one and the same plane, which is inclined at an angle of approximately 10° to a horizontal plane with the end portion on the cooling chamber side located lower than the other end portion. The lower portions of the heat pipes 70 are located over the inner inlet opening 52, while the upper portions are located under the outer inlet opening 60. Being of a wickless type, the heat pipes 70 are each composed of a straight pipe body sealed at either end and a refrigerant sealed in the pipe body. The pipe body is formed of copper, and Freon R-12 (trademark) is used for the refrigerant. The lower portions of the heat pipes 70 inside the cooling chamber 48 are defined as a refrigerant evaporating section, while the upper portions of the heat pipes 70 inside the radiating chamber 50 are defined as a refrigerant condensing section.

The heat pipes 70 are fitted through the full length with a plurality of fins 72 which extend at regular intervals and in parallel with the partition wall 46. The fins 72 are formed of aluminum, and are intended to increase the area in contact with air to improve endothermic/exothermic effect.

Now there will be described the operation of the cooling apparatus 42 with the above-mentioned construction.

When the motor 67 is started, both fans 54 and 66 are driven. Then, heated air in the closed housing 40 forms a circulating air stream which passes through the inner inlet opening 52, the evaporating section of the heat exchanger 68, the gap between the one baffle plate 56 and the top plate of the casing 44, the one fan 58, and the inner outlet opening 54, and returns to the housing 40. On the other hand, the outside air colder than the air inside the closed housing 40 forms another circulating air stream which passes through the outer inlet opening 60, the condensing section of the heat exchanger 68, the gap between the other baffle plate 64 and the bottom plate of the casing 44, the other fan 66, and the outer outlet opening 62, and returns to the outside.

Thereupon, the air heated in accordance with the operation of the process computer in the housing 40 exchanges heat with the evaporating section of the heat exchanger 48 as the former passes through the latter. Namely, at the evaporating section, the refrigerant in a liquid phase absorbs heat from the ambience to be evaporated. Thus, the ambient air at the evaporating section is cooled. The evaporated refrigerant rises up through the heat pipes 70 to reach the condensing section, where it radiates heat to the ambience to be liquefied. Thus, the ambient air at the condensing section is heated. The liquefied refrigerant falls down the heat pipes 70 by its own weight to return to the evaporating section.

Accordingly, the heated air in the housing 40 is cooled as it passes through the evaporating section of the heat exchanger 68, and thus the air temperature inside the housing 40 is prevented from rising. On the other hand, the air heated at the condensing section of the heat exchanger 68 is discharged into the outside. Hereupon, the temperature of the outside air will never greatly be increased by any substantial difference in mass.

According to this embodiment, as described in detail above, the cooling apparatus 42 is mounted on the top of the housing 40. Therefore, the setting area required for the housing 40 never increases, so that the restrictions on the setting location of the housing 40 can be reduced by a large margin. Moreover, since the air at the upper portion of the housing 40 which is at the highest temperature can be cooled, the cooling efficiency may greatly be improved.

Since the setting space of the cooling apparatus 42 is shifted from the side face of the housing 40, which is conventionally fitted with various components and implements, to the top face clear of obstacles, the degree of freedom of the housing 40 in design may be improved to facilitate installation work and to ensure general use of the cooling apparatus 42.

Further, the mounting of the cooling apparatus 42 on the top of the housing 40 eliminates the conventional restrictions on the length of the heat pipes that are inevitable in the case where the cooling apparatus is mounted on the side face of the housing. As compared with the case of the prior art apparatus, therefore, the same effect may be obtained with use of a smaller number of longer wickless heat pipes, which leads to a reduction in cost.

Since the fans 54 and 66 can enjoy increased setting space, large-sized fans can be used for them. Thus, the same amount of air flow may be provided by lower-speed operation, so that noise performance can be improved. Owing to the coaxial arrangement, moreover, the two fans 54 and 66 can share in common a single motor as their driving source, which, along with the simplified structure of coupling means, leads to simplification of the apparatus in construction.

According to this embodiment, furthermore, the cooling apparatus 42 is mounted on the top of the housing 40 so that the heat pipes 70 thereof are inclined at an angle of approximately 10° to the horizontal plane. Accordingly, the overall height of the cooling apparatus can be reduced as compared with the case where the heat pipes are erected upright on the top of the housing. Namely, the restrictions on the setting space can be reduced. If arranged horizontally, the heat pipes of the cooling apparatus need be of a wick-type which costs high. According to the embodiment, however, the inclination of the heat pipes 70 enables the refrigerant, after condensation, to return to the evaporating section by its own weight. Thus, it is possible to use the cheap wickless-type heat pipes without suffering high cost.

Since the motor 68 is disposed in the radiating chamber 50, moreover, the interior of the housing 40 will never be heated by heat generated at the drive of the motor 68.

It is to be understood that this invention is not limited to the construction of the above-mentioned embodiment, and that various changes and modifications may be effected therein by one skilled in the art without departing from the scope or spirit of the invention.

For example, the series of heat pipes of the heat exchanger, which are arranged in a single layer in the above embodiment, may be arranged in a plurality of layers. With such alternative arrangement, the cooling efficiency may additionally be improved.

Further, the angle of inclination of the heat pipes need not always be approximately 10°. The desired effect may be obtained with use of any angle within a range from 5° to 15°.

Instead of using the common motor 68 for simultaneously driving the two sirocco fans 58 and 66, furthermore, the fans 58 and 66 may be fitted with their respective motors.

What we claim is:

1. A cooling apparatus for a housing which is provided with an opening at the upper part thereof, comprising:
   a casing located on the upper part of the housing and including a bottom plate to close the opening and a chamber;
   a partition wall provided in the casing to divide the chamber into a first chamber section and a second chamber section;

said bottom plate having a first inlet opening and a first outlet opening, said first chamber section communicating with the interior of the housing by means of the first inlet opening and the first outlet opening, and said casing having a second inlet opening and a second outlet opening, said second chamber section communicating with the exterior of the housing by means of the second inlet opening and the second outlet opening;

heat exchange means including a plurality of heat pipes provided in the casing through the partition wall with coolant therein for exchanging heat in the first chamber section with heat in the second chamber section, each of said heat pipes having one end portion in the second chamber section above the first inlet opening and the other end portion in the second chamber section under the second inlet opening, wherein said plurality of heat pipes are disposed in an inclined plane such that said one end portion is located lower than said other end portion;

a first fan provided in the first chamber section to generate a first air stream passing through the first inlet opening and the first outlet opening and passing by the one end portion of the heat pipe;

a second fan provided in the second chamber section to generate a second air stream passing through the second inlet opening and the second outlet opening and passing by the other end portion of said heat pipe; and driving means provided in the casing for driving the first and second fans.

2. The cooling apparatus according to claim 1, wherein said partition wall extends vertically, and said first and second chamber sections are divided horizontally from each other.

3. The cooling apparatus according to claim 2, wherein said first fan has a first discharge port communicating with the first outlet opening, and said second fan has a second discharge port communicating with the second outlet opening.

4. The cooling apparatus according to claim 3, wherein said casing has a top plate in which said second inlet and outlet openings are formed.

5. The cooling apparatus according to claim 4, wherein said second outlet opening has a projection on the top plate of said casing, said projection being positioned opposite to the first outlet opening with the partition wall therebetween.

6. The cooling apparatus according to claim 5, wherein said first and second fans have their respective driven shafts in alignment with each other.

7. The cooling apparatus according to claim 6, wherein said driving means includes a motor having a driving shaft in alignment with the driven shafts of said first and second fans, and a coupling mechanism for coupling the driving shaft with the driven shafts to transmit the rotation of the driving shaft to the driven shafts.

* * * * *